US011677212B2

(12) United States Patent
Bachmann et al.

(10) Patent No.: US 11,677,212 B2
(45) Date of Patent: Jun. 13, 2023

(54) SEMICONDUCTOR LASER DIODE AND SEMICONDUCTOR COMPONENT

(71) Applicant: OSRAM OLED GmbH, Regensburg (DE)

(72) Inventors: Alexander Bachmann, Ismaning (DE); Roland Heinrich Enzmann, Penang (MY); Michael Müller, Garching (DE)

(73) Assignee: OSRAM OLED GMBH, Regensburg (DE)

( * ) Notice: Subject to any disclaimer, the term of this patent is extended or adjusted under 35 U.S.C. 154(b) by 217 days.

(21) Appl. No.: 16/650,766

(22) PCT Filed: Sep. 20, 2018

(86) PCT No.: PCT/EP2018/075486
§ 371 (c)(1),
(2) Date: Mar. 25, 2020

(87) PCT Pub. No.: WO2019/063411
PCT Pub. Date: Apr. 4, 2019

(65) Prior Publication Data
US 2020/0295533 A1    Sep. 17, 2020

(30) Foreign Application Priority Data

Sep. 26, 2017    (DE) .......................... 102017122330.4

(51) Int. Cl.
*H01S 5/024*    (2006.01)
*H01S 5/042*    (2006.01)
(Continued)

(52) U.S. Cl.
CPC ........ *H01S 5/02461* (2013.01); *H01S 5/0234* (2021.01); *H01S 5/0237* (2021.01);
(Continued)

(58) Field of Classification Search
CPC ............. H01S 5/02476; H01S 5/02484; H01S 5/02469; H01S 5/04254; H01S 5/04256; H01S 5/0237; H01S 5/0234
See application file for complete search history.

(56) References Cited

U.S. PATENT DOCUMENTS 5,311,539 A * 5/1994 Behfar-Rad ........... B82Y 20/00
372/50.1
6,636,539 B2 * 10/2003 Martinsen ........... H01S 5/18305
372/36

(Continued)

FOREIGN PATENT DOCUMENTS

DE    102007001743 A1    4/2008
JP        2005228989 A    8/2005
(Continued)

OTHER PUBLICATIONS

International Search Report and Written Opinion of the International Searching Authority, dated Dec. 19, 2018, in related International Application No. PCT/EP2018/075486, 14pages.
(Continued)

*Primary Examiner* — Tod T Van Roy
(74) *Attorney, Agent, or Firm* — MH2 Technology Law Group LLP (57) ABSTRACT

The invention relates to a semiconductor laser diode (1) comprising: —a semiconductor layer sequence (2) having an active region (20) provided for generating radiation; —a radiation decoupling surface (10) which extends perpendicular to a main extension plane of the active region; —a main surface (11) which delimits the semiconductor layer sequence in the vertical direction; —a contact layer (3) which adjoins the main surface; and —a heat-dissipating layer (4), regions of which are arranged on a side of the contact layer facing away from the active region, wherein the contact layer is exposed in places for external electrical (Continued)

contact of the semiconductor laser diode. The invention also relates to a semiconductor component.

22 Claims, 6 Drawing Sheets (51) Int. Cl.
H01S 5/223 (2006.01)
H01S 5/0234 (2021.01)
H01S 5/0237 (2021.01)

(52) U.S. Cl.
CPC ...... *H01S 5/02469* (2013.01); *H01S 5/02484* (2013.01); *H01S 5/04254* (2019.08); *H01S 5/2231* (2013.01); *H01S 2301/18* (2013.01)

(56) References Cited

U.S. PATENT DOCUMENTS

| | | | |
|---|---|---|---|
| 6,680,957 B1 * | 1/2004 | Koike | H01S 5/34333 |
| | | | 372/43.01 |
| 9,281,656 B2 * | 3/2016 | Mueller | H01S 5/221 |
| 9,444,225 B2 * | 9/2016 | Takado | H01S 5/3216 |
| 10,193,303 B2 * | 1/2019 | Taeger | H01S 5/209 |
| 11,011,887 B2 * | 5/2021 | Gerhard | H01S 5/2222 |
| 2002/0074556 A1 | 6/2002 | Kwak et al. | |
| 2006/0176924 A1 * | 8/2006 | Kim | H01S 5/024 |
| | | | 372/50.11 |
| 2008/0075133 A1 | 3/2008 | Day et al. | |
| 2010/0284434 A1 * | 11/2010 | Koenig | H01S 5/2231 |
| | | | 372/46.01 |
| 2011/0243169 A1 * | 10/2011 | Lauer | H01S 5/04256 |
| | | | 372/45.01 |
| 2014/0334508 A1 * | 11/2014 | Lauer | H01S 5/10 |
| | | | 372/36 |
| 2017/0054271 A1 * | 2/2017 | Muller | H01S 5/02469 |
| 2017/0117683 A1 | 4/2017 | Junghans et al. | |

FOREIGN PATENT DOCUMENTS

JP 2013030538 A 2/2013
WO WO-2015154975 A2 * 10/2015 ............. H01S 5/222

OTHER PUBLICATIONS

German Office Action in German Application No. 102017122330.4 dated Jul. 12, 2018, 8 pages.

* cited by examiner

SEMICONDUCTOR LASER DIODE AND SEMICONDUCTOR COMPONENT

CROSS-REFERENCE TO RELATED APPLICATION(S)

This application is a national stage entry from International Application No. PCT/EP2018/075486, filed on Sep. 20, 2018, published as International Publication No. WO 2019/063411 on Apr. 4, 2019, and claims priority under 35 U.S.C. § 119 from German Patent Application No. 102017122330.4, filed on Sep. 26, 2017, the entire contents of all of which are incorporated herein by reference.

The present application relates to a semiconductor laser diode, in particular to a high-power semiconductor laser diode, and to a semiconductor component.

High-power diode lasers, in particular for fiber coupling applications, are often limited no longer by the achievable optical output power or reliability, but above all by their beam quality or brilliance. Particularly, the optical output power for coupling into an optical fiber must be emitted inside a certain solid angle. To this end, the so-called beam parameter product BPP is crucial, which is defined as the product of the emission angle and the area of the light emission. In the case of conventional edge emitters, particularly in the case of broad stripe lasers, the beam quality is limited above all parallel to the layer plane (also referred to as the "slow axis"). Various approaches are adopted in order to reduce the divergence angle along the slow-axis direction and therefore to reduce the beam parameter product. To this end, for example, heat sinks with water cooling are used so as to lower the operating temperature of the laser. Approaches to improve the epitaxial structures used or the structural layout of the resonator, for example lengthening the resonator, are also adopted.

It is an object to provide a semiconductor laser diode which, even with a high optical output power, is distinguished by a low beam parameter product. This object is achieved inter alia by a semiconductor laser diode as claimed in patent claim 1 and a semiconductor component comprising such a semiconductor laser diode. The dependent patent claims relate to further configurations and expediencies.

A semiconductor laser diode is provided. The semiconductor laser diode is, in particular, a high-power semiconductor laser diode. This means that the optical output power is at least 10 W, for example at least 30 W, for instance 50 W.

The semiconductor laser diode is for example an edge emitter, in which a resonator for the radiation to be generated extends perpendicularly to a main extent plane of an active region intended to generate radiation. For example, the semiconductor laser diode is a semiconductor laser with at least predominantly lateral gain guiding. In other words, in the semiconductor laser diode described here, the lateral gain guiding predominates over lateral index guiding in the resonator. The principle of lateral gain guiding is known to the person skilled in the art and will therefore not be mentioned further.

According to at least one embodiment of the semiconductor laser diode, the semiconductor laser diode comprises a semiconductor layer sequence having an active region intended to generate radiation. The active region is, for example, intended to generate radiation in the ultraviolet, visible or infrared spectral range. The active region is, for example, arranged between a first semiconductor layer and a second semiconductor layer, the first semiconductor layer and the second semiconductor layer differing from one another at least in places in respect of their conduction type so that the active region is located in a pn junction.

According to at least one embodiment of the semiconductor laser, a radiation output surface of the semiconductor laser diode extends perpendicularly to a main extent plane of the active region. The radiation output surface forms in particular an interface of the resonator for the radiation to be generated in the active region. A main emission axis of the semiconductor laser diode extends perpendicularly to the radiation output surface and parallel to the main extent plane of the active region.

The semiconductor laser diode furthermore comprises a main surface, which delimits the semiconductor layer sequence in the vertical direction. The vertical direction refers to a direction which extends perpendicularly to the main extent plane of the active region According to at least one embodiment of the semiconductor laser diode, the semiconductor laser diode comprises a contact layer which is adjacent to the main surface. The contact layer is intended during operation of the semiconductor laser diode to inject charge carriers into the adjacent semiconductor material of the semiconductor layer sequence. The contact layer is, in particular, intended for the external electrical contacting of the semiconductor laser diode, particularly on the side of the main surface.

According to at least one embodiment of the semiconductor laser diode, the semiconductor laser diode comprises a heat-dissipating layer, which is arranged in regions on a side of the contact layer facing away from the active region. In particular, the heat-dissipating layer does not fully cover the contact layer, so that the contact layer is exposed in places for the external electrical contacting of the semiconductor laser diode.

A heat-dissipating layer is regarded as a layer which has a high thermal conductivity, in particular of least 100 W/(K*m).

In at least one embodiment, the semiconductor laser diode comprises a semiconductor sequence having an active region intended to generate radiation, a radiation output surface, which extends perpendicularly to a main extent plane of the active region, a main surface, which delimits the semiconductor layer sequence in the vertical direction, a contact layer which is adjacent to the main surface, and a heat-dissipating layer, which is arranged in regions on a side of the contact layer facing away from the active region, the contact layer being exposed in places for external electrical contacting of the semiconductor laser diode.

The contact layer forms a mounting surface 15 of the semiconductor laser diode 1. The semiconductor laser diode may be fastened on this mounting surface to a heat sink by a connecting medium, for instance an adhesive, in order to produce a semiconductor component. The thermal conductivity of typically used solders, for example solders containing AuSn, lies in the range of 50 W/(K*m) or less, so that this layer is often the layer which has the greatest thermal resistance in the heat path to the heat sink. The connecting medium is replaced in places with the heat-dissipating layer. This heat-dissipating layer has a thermal conductivity that is higher, for example at least two times as high, at least four times as high or even at least ten times as high, in comparison with the connecting medium. The heat-dissipating layer thus locally increases the heat dissipation from the semiconductor laser diode in the vertical direction.

According to at least one embodiment, the heat dissipating layer has a thermal conductivity of at least 100 W/(K*m). For example, the heat-dissipating layer contains diamond-like carbon (DLC), a carbide, for instance silicon carbide or boron carbide, a nitride, for instance aluminum nitride or boron nitride or beryllium nitride, or an oxide, for instance beryllium oxide. Diamond-like carbon may, for example, be deposited in such a way that it has a thermal conductivity of 500 W/(K*m) or more, for instance by means of plasma deposition.

According to at least one embodiment of the semiconductor laser diode, the heat-dissipating layer is electrically insulating. The heat-dissipating layer is thus used only for the thermal contacting, but not for the electrical contacting, of the semiconductor laser diode. In other words, spatial separation takes place between the regions in which the electrical contacting takes place and the regions via which the thermal dissipation predominantly takes place.

According to at least one embodiment of the semiconductor laser diode, in a plan view of the semiconductor laser diode, the heat-dissipating layer is arranged to at least 70% of its total area inside an energizing region. The energizing region is the region in which the contact layer injects charge carriers through the main surface into the semiconductor layer sequence. The heat-dissipating layer is thus predominantly, for example even up to at least 90% or fully, arranged inside the energizing region. In other words, the thermal dissipation is deliberately increased in the region of the semiconductor laser diode in which the greatest heat loss densities also occur.

In a region which lies outside the energizing region as seen in the transverse direction, on the other hand, the heat-dissipating layer is not present or is present only to a small extent. The transverse direction refers to a direction which extends parallel to the main extent plane of the active region and parallel to the radiation output surface. During operation of the semiconductor laser diode, a temperature profile is therefore set up which has a smaller temperature gradient at the edge of the energizing region. By such a temperature profile, the effect of the self-focusing due to a thermal lens effect in the material of the semiconductor laser diode can be reduced. By avoiding or at least reducing the effect of self-focusing, the emission angle in the transverse direction, and therefore the beam parameter product, can be reduced.

According to at least one embodiment of the semiconductor laser diode, the heat-dissipating layer comprises at least one opening in which the contact layer is exposed, the opening of the heat-dissipating layer having an aspect ratio of at most 1:1. The aspect ratio in this case refers to the ratio between the maximum vertical extent of the opening and the minimum lateral extent of the opening. In other words, the aspect ratio is equal to the vertical extent divided by the lateral extent. The opening is thus at least as wide as it is deep, or wider than it is deep, to make it easier to fill with solder. Preferably, the aspect ratio is at most 1:1.5 or at most 1:2. In particular, all the openings of the heat-dissipating layer have such an aspect ratio. It has been found that openings having such an aspect ratio can be filled efficiently with a connecting medium during assembly of the semiconductor laser diode. Unfilled subregions of the openings, on the other hand, lead to a significant increase in the thermal resistance and may detrimentally impair the function of the semiconductor laser diode and/or its lifetime.

According to at least one embodiment of the semiconductor laser diode, a material coverage of the contact layer with the heat-dissipating layer decreases on average starting from a main emission axis with an increasing distance from the main emission axis and/or starting from the radiation output surface with an increasing distance from the radiation output surface.

The higher the material coverage of the contact layer with heat-dissipating layer locally is, the more efficient the thermal dissipation in the corresponding region is. During operation of the semiconductor laser diode, a temperature profile is set up in the transverse direction, which has its temperature maximum on the main emission axis. Along the main emission axis, the temperature is typically highest in the region of the radiation output surface.

In other words, the material coverage of the contact layer with the heat dissipating layer is varied in such a way that the most efficient thermal dissipation takes place in the regions in which the greatest power loss density occurs locally.

According to at least one embodiment of the semiconductor laser diode, an area coverage of the contact layer with the heat-dissipating layer decreases on average starting from a main emission axis with an increasing distance from the main emission axis. For example, the heat-dissipating layer comprises subregions separated from one another at least in places, a transverse extent of the subregions decreasing with an increasing distance from the main emission axis and/or a spacing of the subregions increasing with an increasing distance from the main emission axis.

According to at least one embodiment of the semiconductor laser diode, an area coverage of the contact layer with the heat-dissipating layer decreases on average starting from the radiation output surface with an increasing distance from the radiation output surface. For example, the heat-dissipating layer comprises subregions separated from one another at least in places, a spacing of the subregions increasing with an increasing distance from the radiation output surface and/or an extent of the subregions decreasing along the main emission axis.

The heat-dissipating layer is thus structured in such a way that the thermal dissipation is more efficient in the region of the radiation output surface than in regions which are further away from the radiation output surface.

According to at least one embodiment of the semiconductor laser diode, any point in the heat-dissipating layer is at most 10 μm, in particular at most 5 μm, away from the contact layer in a plan view of the semiconductor laser diode. Even in the case of a heat-dissipating layer configured to be electrically insulating, it is ensured that charge carriers can be injected with a sufficient homogeneity through the main surface into the semiconductor layer sequence.

According to at least one embodiment of the semiconductor laser diode, a vertical extent of the heat-dissipating layer varies. The material coverage of the contact layer with the heat-dissipating layer may thus, as an alternative or in addition to lateral structuring, also be achieved by means of the locally varying thickness of the heat-dissipating layer. At the positions where the heat-dissipating layer is thickest, the thermal dissipation from the semiconductor laser diode during operation is most efficient.

According to at least one embodiment of the semiconductor laser diode, the vertical extent of the heat-dissipating layer decreases with an increasing distance from the radiation output surface. Heat dissipation from the semiconductor laser diode is thus greater in the region of the radiation output surface than in regions with are further away from the radiation output surface along the main emission axis.

According to at least one embodiment of the semiconductor laser diode, the vertical extent of the heat-dissipating layer decreases with an increasing distance from a main emission axis. The thickness of the heat-dissipating layer is thus varied in such a way that the thermal dissipation is higher in the region of the main emission axis than in regions which are further away from the main emission axis in the transverse direction.

According to at least one embodiment of the semiconductor laser diode, a thermal barrier layer is arranged on the semiconductor layer sequence outside the energizing region. A thermal barrier layer is in particular, intended to mean a layer which has a thermal conductivity of at most 30 W/(K*m), in particular at most 10 W/(K*m). By means of such a thermal barrier layer, the vertical thermal conduction from the semiconductor layer sequence may be deliberately reduced outside the energizing region. The shape of the temperature profile set up, and the refractive index profile resulting therefrom, may thus be substantially flattened in the transverse direction. For example, the thermal barrier layer is also configured to be electrically insulating.

According to at least one embodiment of the semiconductor laser diode, the thermal barrier layer is arranged inside the contact layer in the vertical direction. This means that material of the contact layer is located on both sides of the thermal barrier layer, as seen in the vertical direction. In contrast thereto, however, the thermal barrier layer may also be arranged at a different position in the thermal path in the direction of the heat sink.

A semiconductor component comprises at least according to one embodiment a semiconductor laser diode having at least one of the features described above. The semiconductor component furthermore comprises a heat sink, the semiconductor laser diode being fastened on the heat sink by a connecting medium. The connecting medium is adjacent, in particular directly, to the heat-dissipating layer and the contact layer. For example, the connecting medium is a solder.

According to at least one embodiment of the semiconductor component, the heat-dissipating layer has at least two times as great, for example at least four times as great, a thermal conductivity as the connecting medium. The greater the difference between the thermal conductivity of the connecting medium and the thermal conductivity of the heat-dissipating layer is, the more efficiently the thermal dissipation from the semiconductor laser diode through the heat-dissipating layer can be increased. Further configurations and expediencies may be found in the following description of exemplary embodiments in connection with the figures.

Elements which are the same, of the same type, or which have the same effect, are provided with the same references in the figures.

The figures are respectively schematic representations and therefore not necessarily true to scale. Rather, relatively small elements, and in particular layer thicknesses, may be represented exaggeratedly large for illustration.

In the figures, for illustration of the spatial directions, a coordinate system is sometimes indicated for the plane of the drawing, the x direction relating to a transverse direction perpendicular to a main radiation axis, the y direction relating to a direction perpendicular to a main extent plane of the active region, and the z axis relating to a direction along the main emission axis.

Figure 1A:
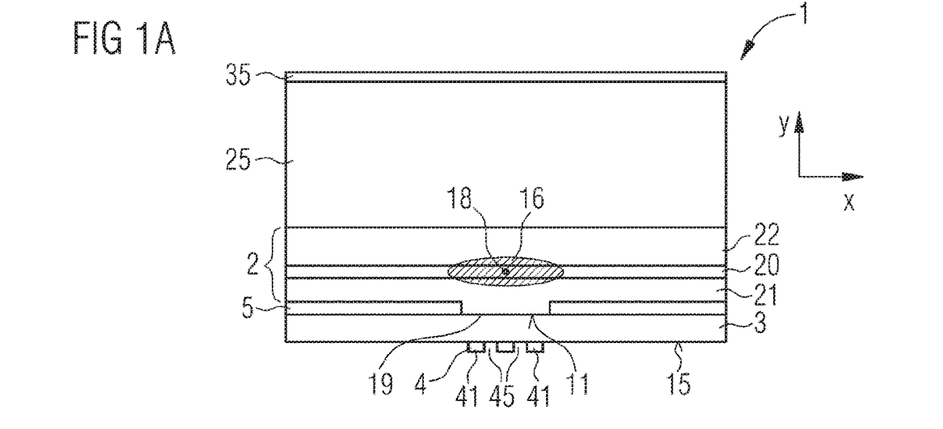
FIG. 1A shows an exemplary embodiment of a semiconductor laser diode in a schematic sectional view.
Figure 4:
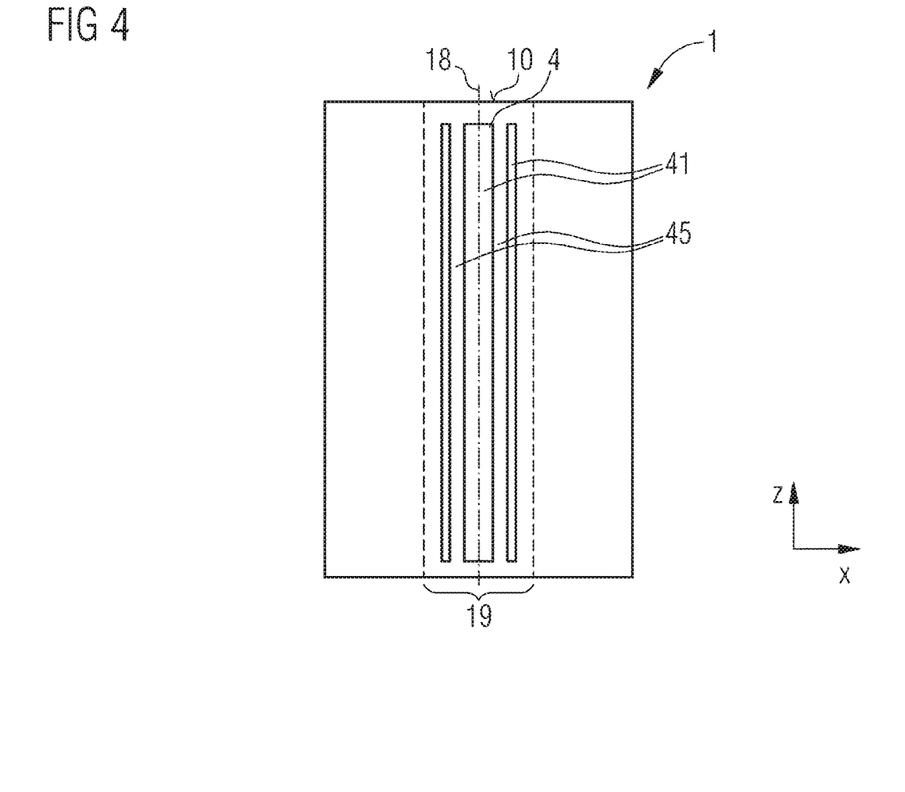
FIG. 4 shows an exemplary embodiment of a semiconductor laser diode in a schematic plan view.

FIG. 1A shows an exemplary embodiment of a semiconductor laser diode in a schematic sectional view, the section extending parallel to a radiation output surface 10 shown by way of example in FIG. 4.

The semiconductor laser diode 1 comprises a semiconductor layer sequence 2 having an active region 20 intended to generate radiation. In the vertical extension, the semiconductor layer sequence 2 extends between a main surface 11 and a carrier 25, on which the semiconductor layer sequence 2 is arranged. Adjacent to the main surface 11, there is a contact layer 3 which is exposed in places for the external electrical contacting of the semiconductor laser diode. Furthermore, a heat-dissipating layer 4 is arranged on the side of the contact layer 3 facing away from the active region 20. The heat-dissipating layer 4 is structured by way of example into a multiplicity of subregions 41. In openings 45 between the subregions 41, the contact layer is exposed so that charge carrier injection can take place at these positions through the contact layer into the semiconductor layer sequence 2.

The charge carrier injection takes place through an energizing region 19, in which the contact layer 3 is adjacent to the semiconductor layer sequence 2. Laterally with respect to the energizing region 19, a passivation layer 5 is arranged on the semiconductor layer sequence 2, so that no direct current injection takes place in the vertical direction at the positions which are covered by the passivation layer.

The energizing region 19 gives rise to a main emission region 16, in which the majority of the radiation to be generated in the active region and to be amplified in the resonator propagates. For example, the main emission region defines the region in which the radiation emission is greater than or equal to 1/e times the maximum radiation power.

The active region 20 is arranged between a first semiconductor layer 21 and a second semiconductor layer 22. For example, the first semiconductor layer is p-conductive and the second semiconductor layer is n-conductive, or vice versa. The semiconductor laser diode 1 can be externally electrically contacted via the contact layer 3 and a further contact layer 35, so that during operation of the semiconductor laser diode, by application of an external electrical voltage between the contact layer 3 and the further contact layer 35, charge carriers can be injected from opposite directions into the active region and recombine there with the emission of radiation. The radiation output surface 10 forms, together with an opposite side surface of the semiconductor laser diode, a resonator for the radiation generated in the active region during operation. The semiconductor laser diode is, in particular, configured as a broad stripe high power semiconductor laser diode having an output power of at least 10 W, in particular at least 30 W, for example 50 W or more.

Figure 2A:
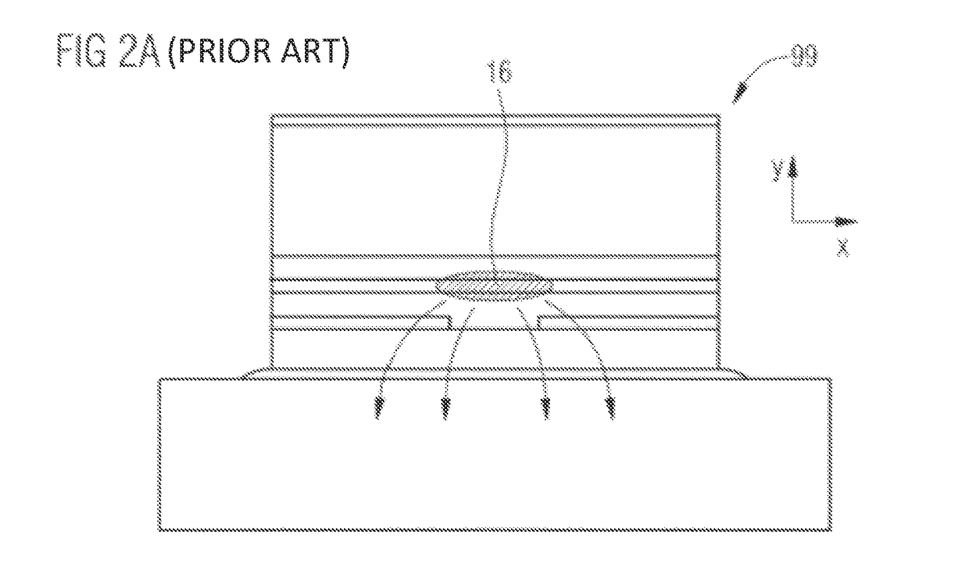
FIG. 2A shows a representation of a comparative specimen without a heat dissipating layer with an associated temperature profile in FIG. 2B, and associated refractive index profile in FIG. 2C and a schematic representation of the beam profile in a plan view of the comparative specimen in FIG. 2D.
Figure 2B:
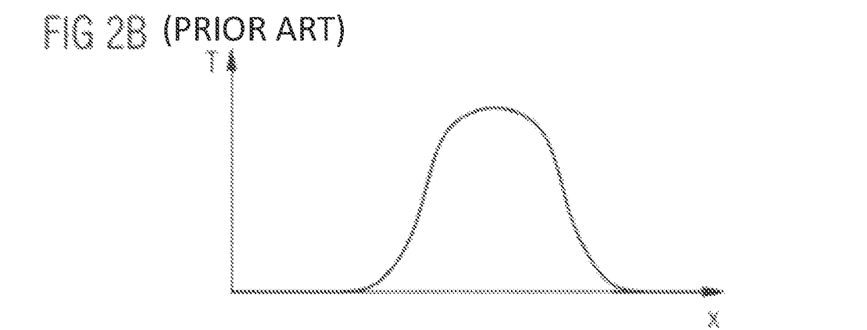
Figure 2C:
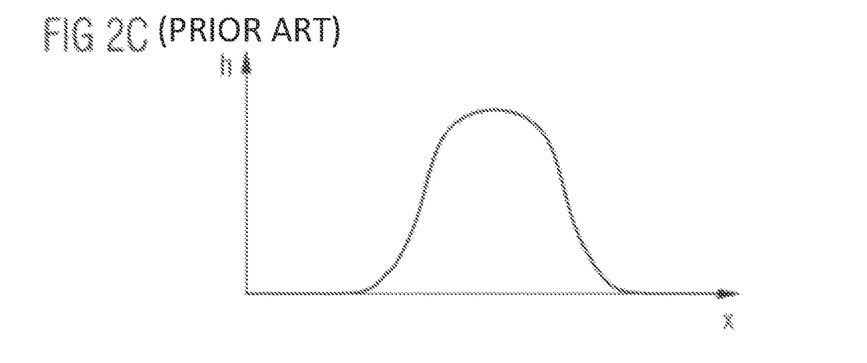
Figure 2D:
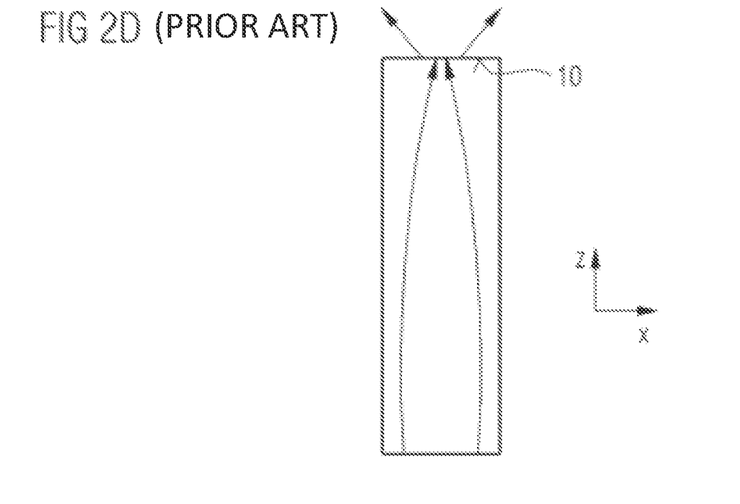

FIG. 2A shows a comparative example 99 of a semiconductor laser diode without a heat dissipating layer 4. The greatest heat loss also occurs in the main emission region 16 so that, as represented in FIG. 2B, a temperature profile is set up in the transverse direction, which decreases relatively greatly at the edge of the main emission region 16. FIG. 2C shows an associated refractive index profile in the semiconductor layer sequence 2, which correlates with temperature change. This refractive index profile leads, as schematically represented in a plan view in FIG. 2D with the aid of arrows, to self-focusing inside the semiconductor laser diode, which leads to an increased beam divergence in the transverse direction, i.e. along the slow axis, after the radiation exit from the radiation output surface 10.

Figure 1B:
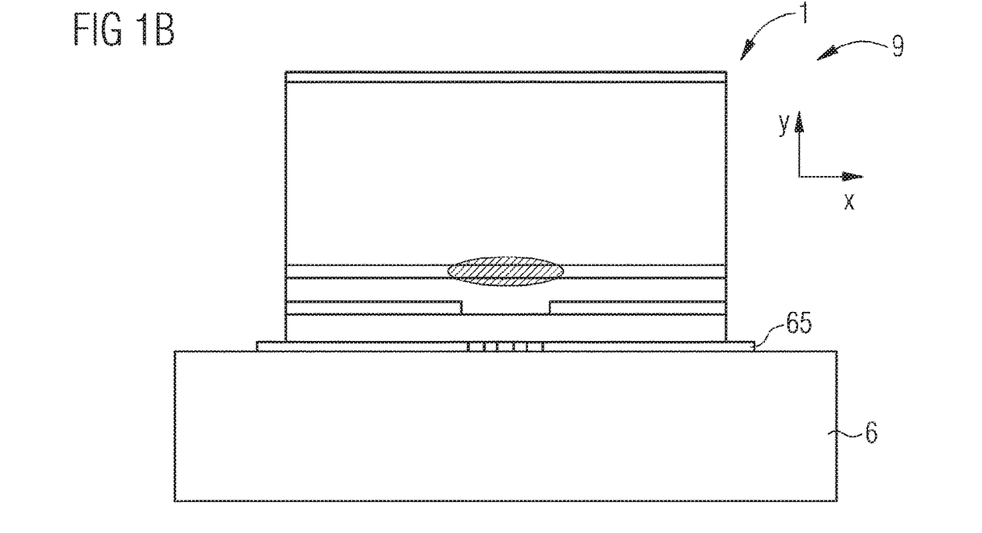
FIG. 1B shows an exemplary embodiment of a semiconductor component having such a semiconductor laser diode.

FIG. 1B shows a semiconductor component 9 having a semiconductor laser diode 1 according to FIG. 1A and a heat sink 6, the semiconductor laser diode 1 being fastened on the heat sink by a connecting medium 65, for instance a solder. The connecting medium 65 is directly adjacent to the contact layer 3 and the heat-dissipating layer 4. In particular, the connecting medium 65 fully, or at least substantially fully, fills the openings 45 inside heat-dissipating layer. In contrast to the temperature profile represented in FIG. 2B, the heat-dissipating layer 4 produces a temperature profile which decreases more flatly at the edge of the main emission region 16. Furthermore, the maximum temperature occurring in the region of the main emission region 16 is significantly reduced by means of the heat-dissipating layer.

Figure 1C:
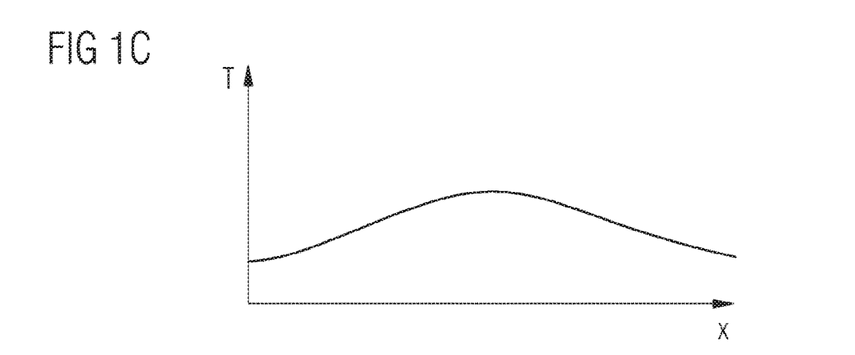
FIG. 1C shows a schematic profile of the temperature during operation of the semiconductor laser diode along a transverse direction x.

In the transverse direction, the heat-dissipating layer 4 is structured in such a way that a material coverage of the contact layer 3 with the heat-dissipating layer 4 is greatest in the regions in which the power loss density is greatest. In particular, the heat-dissipating layer is arranged to at least 70% of its total area, or at least 90%, or as shown in FIG. 1B, fully inside the energizing region 19 as seen in a plan view of the semiconductor laser diode. Outside the energizing region, the thermal dissipation from the semiconductor laser diode 1 is thus not, or at least not substantially, increased by means of the heat-dissipating layer, so that the flat profile of the temperature profile in the transverse direction shown in FIG. 1C is set up.

By means of the heat-dissipating layer 4, the length of which the heat has to pass through the connecting medium 65 in the vertical direction is locally reduced. Since a connecting medium, for example a conventionally used AuSn solder, has a thermal conductivity of only 50 W/(K*m) or less a particularly significant improvement in the thermal dissipation properties may be achieved by positioning the heat-dissipating layer 4 inside the connecting medium 65. Suitable for the heat-dissipating layer is, for example, diamond-like carbon, which may be produced by plasma deposition with a thermal conductivity of 500 W/(K*m) or more. The thermal conductivity of the heat-dissipating layer may thus be up to ten times higher than the thermal conductivity of the connecting medium 65. An improvement of the temperature properties is, however, also achieved with a material for the heat-dissipating layer that has a lower thermal conductivity, for instance a thermal conductivity of at least 100 W/(K*m). In particular, another of the materials mentioned in the general part in connection with the heat-dissipating layer may be used for the heat-dissipating layer.

It has been found that the beam divergence in the transverse direction, and therefore the beam parameter product, can be reduced in this way. The described semiconductor guide laser is therefore particularly suitable in particular for fiber input coupling, since with the same optical output power more light power can be coupled into the fiber. This leads to a cost advantage in the system.

With the described configuration of the heat-dissipating layer, the undesired effect of the thermal lens in the semiconductor laser diode is not achieved in particular, or at least not only, by way of a degradation of the thermal conductivity in outer regions of the semiconductor laser diode, i.e. at relatively large distances from the main emission axis 18, which would necessarily lead to an increase in the temperature inside the semiconductor laser diode, and therefore to a reduced efficiency of the semiconductor laser diode. Rather, the temperature in the semiconductor laser diode during operation is reduced by the heat-dissipating layer, in particular locally in the regions in which the power loss density is particularly high. The efficiency of the semiconductor laser diode is therefore increased, and at the same time the beam quality is improved.

In other words, the detrimental effect of the thermal lens is achieved, in particular, by the relatively poorly thermally conductive connecting medium 65 being replaced in places with the heat-dissipating layer 4 in a thermal path between the active region 20 and the heat sink 6. The electrical contacting may then be carried out through the regions of the contact layer 3 which are not covered by the heat-dissipating layer 4.

For example, the heat-dissipating layer is configured in the lateral direction in such a way that it does not, or at least does not substantially, impede a homogeneous lateral current injection. For example, at most 10 μm of the contact layer 3 is removed at any point in the heat-dissipating layer 4 in a plan view of the semiconductor laser diode 1.

The openings 45 of the heat-dissipating layer 4, in which the contact layer is exposed, preferably have an aspect ratio of at most 1:1, in particular at most 1:1.5 or 1:2. By a sufficiently low aspect ratio, full filling of the openings 45 with the connecting medium 65 may be achieved in a simplified way during mounting on the heat sink.

Figure 3A:
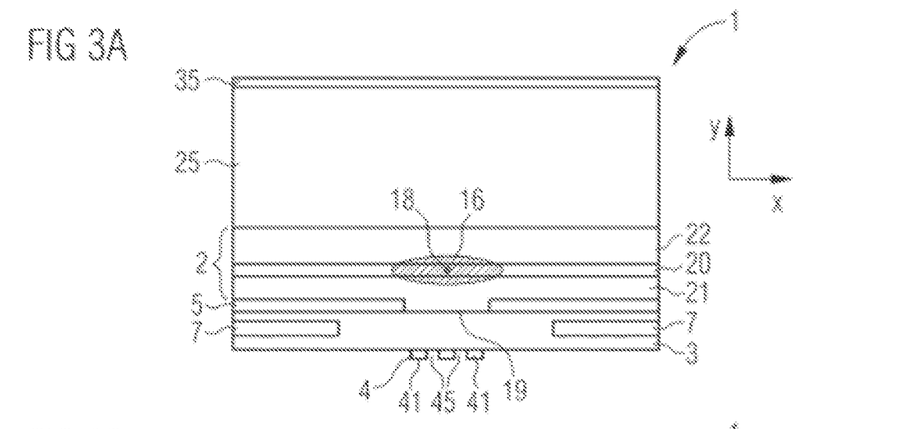
FIGS. 3A and 3B respectively show an exemplary embodiment of a semiconductor laser diode in a schematic sectional view.
Figure 3B:
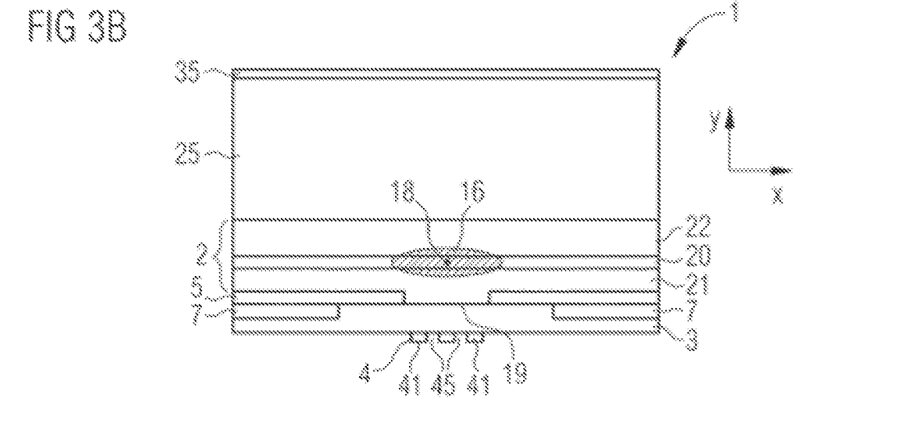

Further exemplary embodiments of a semiconductor laser diode are shown in a sectional view in FIGS. 3A and 3B. These exemplary embodiments correspond substantially to the exemplary embodiment described in connection with FIG. 1A.

In contrast thereto, the semiconductor laser diode 1 comprises a thermal barrier layer 7. The thermal barrier layer 7 is, in particular, arranged in an edge region of the semiconductor laser diode, for instance at a greater distance from the main emission axis and an outer edge of the energizing region 19. By means of thermal barrier layer 7, the thermal dissipation in the edge region of the semiconductor laser diode 1 may be reduced deliberately so that the formation of a relatively flatly shaped temperature profile during operation of the semiconductor laser diode is promoted further. The thermal barrier layer 7 is located in a thermal path from the active region 20 in the direction of the heat sink. In FIG. 3A, the thermal barrier layer 7 is arranged inside the contact layer 3, and there is material of the contact layer 3 on both sides of the thermal barrier layer 7 as seen in the vertical direction.

In the exemplary embodiment represented in FIG. 3B, the thermal barrier layer 7 is arranged on the side of the contact layer 3 facing the semiconductor layer sequence 2.

For example, silicon oxide or another material having a thermal conductivity of at least 30 W/(K*m), in particular of at least 10 W/(K*m), is suitable for the thermal barrier layer 7.

Figure 5:
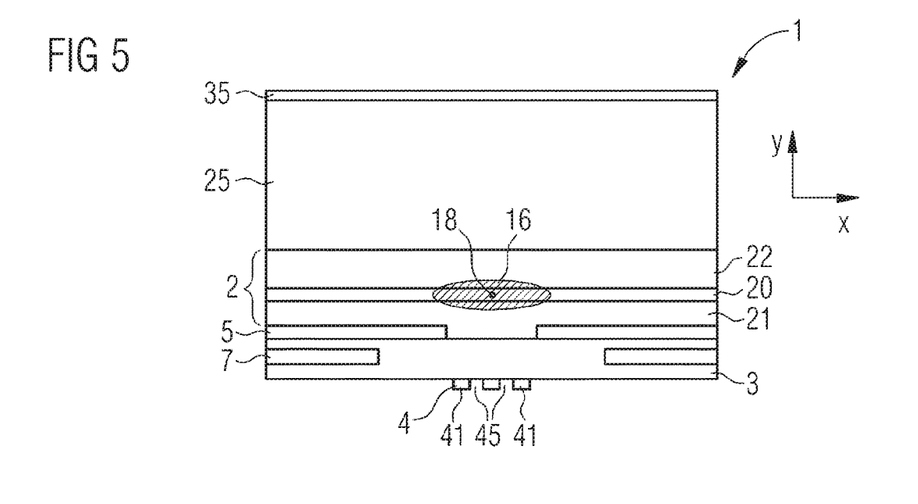
FIG. 5 shows an exemplary embodiment of a semiconductor laser diode in a schematic sectional view.

FIGS. 4 and 5 respectively show an exemplary embodiment of a semiconductor laser diode, these exemplary embodiments corresponding substantially to the exemplary embodiments described in FIGS. 1A and 3A. In both exemplary embodiments, the material coverage of the contact layer 3 with the heat-dissipating layer 4 varies starting from the main emission axis 18 in such a way that the material coverage decreases on average with an increasing distance from the main emission axis. This is achieved in these exemplary embodiments in that the subregions 41 of the heat dissipating layer 4 have a decreasing transverse extent with an increasing distance from the main emission axis 18. As an alternative or in addition, the distance between neighboring subregions can also increase with an increasing distance from the main emission axis 18.

The local thermal dissipation properties may be adapted deliberately to the respective locally occurring power loss density, in particular in the region of the energizing region 19.

FIGS. 6A, 6B, 6C and 6D respectively represent exemplary embodiments of a semiconductor laser diode in a plan view, these exemplary embodiments differing in terms of the local area coverage density of the heat dissipating layer 4.

Figure 6A:
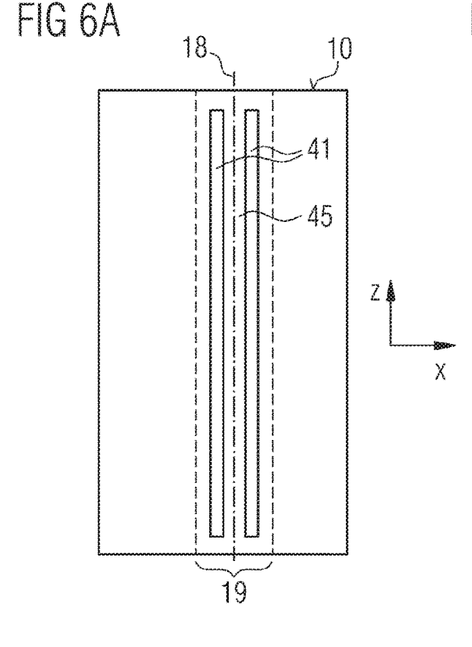
FIGS. 6A, 6B, 6C and 6D respectively show an exemplary embodiment of a semiconductor laser diode in a schematic plan view.

In the exemplary embodiment represented in 6A, the subregions 41 of the heat-dissipating layer have a constant width along the main emission axis. The subregions are arranged laterally next to one another in the transverse direction.

Figure 6B:
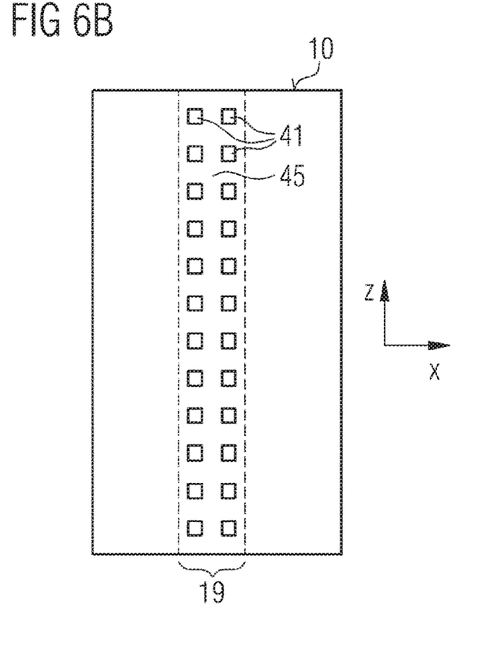

In the exemplary embodiment represented in FIG. 6B, the heat-dissipating layer is subdivided into subregions 41 which are arranged next to one another both along the main emission axis 18 and perpendicularly thereto in the transverse direction.

Figure 6C:
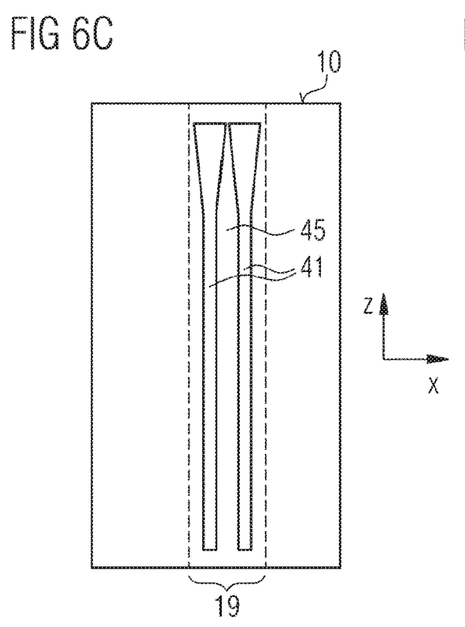

In contrast to FIG. 6A, the width of the subregions 41 in the exemplary embodiment represented in FIG. 6C increases in places in the direction of the radiation output surface 10. In this way, the contact layer is on average covered more greatly with material of the heat-dissipating layer 4 in the region of the radiation output surface 10 than in regions which are further away from the radiation output surface. Along the main emission axis, the temperature is typically greatest in the region of the radiation output surface 10. By the described greater coverage with the heat-dissipating layer 4 in this region, a temperature gradient resulting therefrom can be avoided.

Figure 6D:
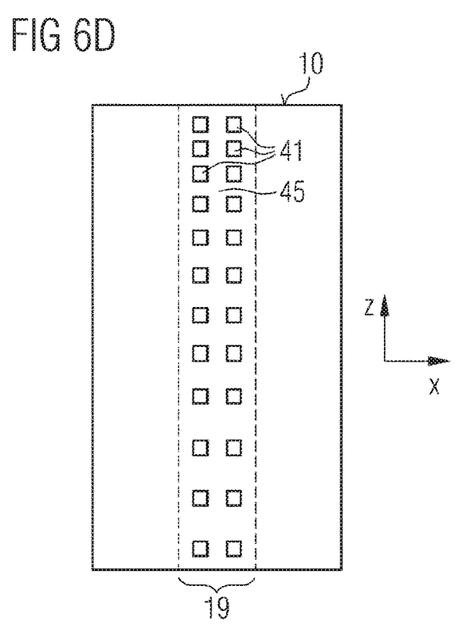

This effect may also be achieved in the embodiment of the heat dissipating layer 4 as represented in FIG. 6D. In this configuration, the spacing of neighbouring subregions 41 of the heat-dissipating layer varies in such a way that the average distance between neighboring subregions along the main emission axis 18 increases with an increasing distance from the radiation output surface 10. As an alternative or in addition, the extent of the subregions 41 in the lateral direction, i.e. along the main emission axis 18 or perpendicularly thereto, may decrease with an increasing distance from the radiation output surface 10.

Figure 7A:
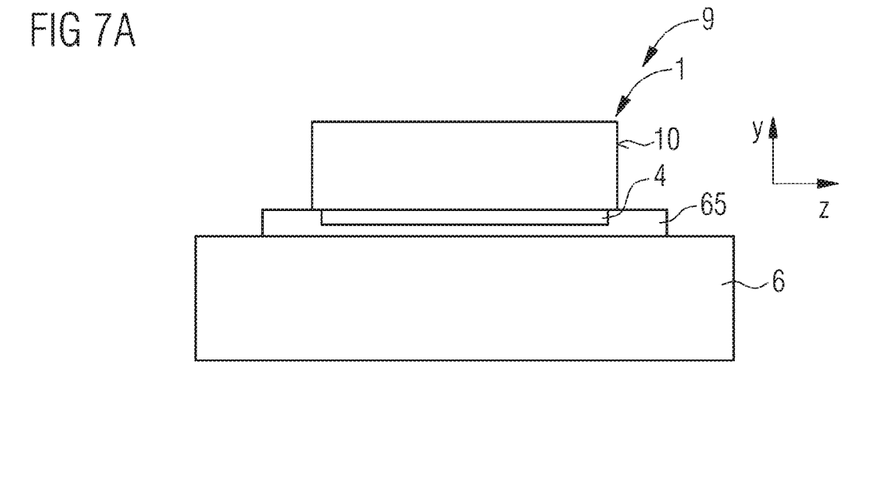
FIGS. 7A, 7B and 7C respectively show an exemplary embodiment of a semiconductor laser diode in a schematic sectional view along the main emission axis (FIGS. 7A and 7B) perpendicularly thereto (FIG. 7C).
Figure 7B:
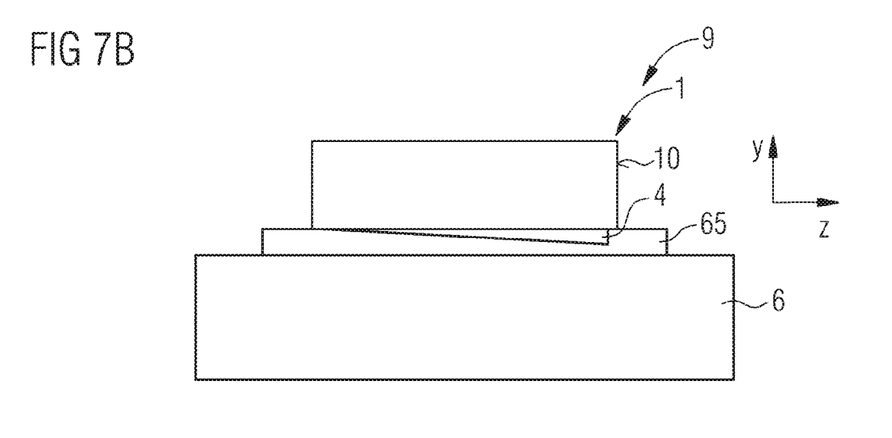
Figure 7C:
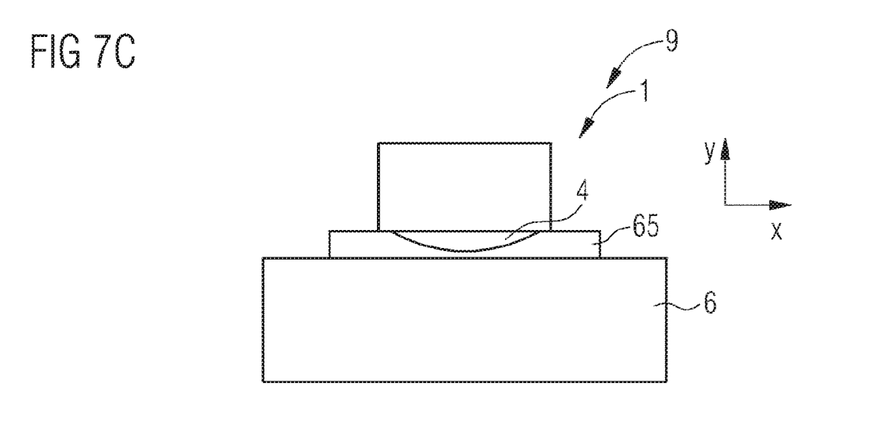

FIGS. 7A to 7C show exemplary embodiments of the configuration of the heat dissipating layer in the vertical direction, i.e. along the y direction. These configurations are suitable for all exemplary embodiments described above.

Details of the semiconductor laser diode 1 are not explicitly shown for simplified representation, and may be configured as described above. In the exemplary embodiment shown in FIG. 7A, the heat-dissipating layer 4 continuously has a constant thickness, i.e. a concert vertical extent. Such a heat-dissipating layer is particularly simple to produce.

In the exemplary embodiment represented in FIG. 7B, the thickness of the heat-dissipating layer 4 varies. In particular, the thickness decreases with an increasing distance from the radiation output surface 10. A varying material coverage of the contact layer with the heat-dissipating layer 4 may in this case be achieved solely or additionally by a variation of the layer thickness of the heat-dissipating layer 4. The temperature profile along the main emission axis may thus, as described in connection with FIGS. 6c and 6d, be adapted to an increased power loss and therefore the increased temperature in the region of the radiation output surface 11.

In the exemplary embodiment represented in FIG. 7C, the thickness of the heat-dissipating layer 4 varies in the transverse direction. In particular, the thickness decreases with an increasing distance from the main emission axis 18. Of course, the heat-dissipating layer may vary in respect of its vertical extent both in the transverse direction and along the main extent axis.

By means of variation of the vertical extent of the heat-dissipating layer 4 in the transverse direction, as described in connection with FIGS. 1A, 4 and 5, the temperature gradient in the transverse direction may assume a flatter profile during operation of the semiconductor laser diode.

The variation in the vertical extent, as described in connection with FIGS. 7B and 7C, may be carried out as an alternative or in addition to the lateral structuring of the heat-dissipating layer into subregions 41 and openings 45 arranged between them.

The invention is not restricted by the description with the aid of the exemplary embodiments. Rather, the invention covers any new feature and any combination of features, which includes in particular any combination of features in the patent claims, even if this feature or this combination per se is not explicitly indicated in the claims or exemplary embodiments.

This patent application claims the priority of German Patent Application 102017122330.4, the disclosure content of which is incorporated here by reference.

LIST OF REFERENCES 1 semiconductor laser diode
10 radiation output surface
11 main surface
15 mounting surface
16 main emission region
18 main emission axis
19 energizing region
20 active region
21 first semiconductor layer
22 second semiconductor layer
25 carrier
3 contact layer
35 further contact layer
4 heat-dissipating layer
41 subregion of the heat-dissipating layer
45 opening
5 passivation layer
6 heat sink
65 connecting medium 7 thermal barrier layer
9 semiconductor component
99 comparative example

The invention claimed is:

1. A semiconductor laser diode comprising:
a semiconductor sequence having an active region intended to generate radiation;
a radiation output surface, which extends perpendicularly to a main extent plane of the active region;
a main surface, which delimits the semiconductor layer sequence in the vertical direction;
a contact layer which is directly adjacent to the main surface;
a heat-dissipating layer, which is arranged in regions on a side of the contact layer facing away from the active region, the contact layer being exposed in places for external electrical contacting of the semiconductor laser diode, wherein the heat-dissipating layer comprises at least one opening in which the contact layer is exposed, the opening of the heat-dissipating layer having an aspect ratio of at most 1:1, wherein, in a plan view of the semiconductor laser diode, the heat-dissipating layer is arranged to have at least 70% of its total area inside an energizing region, the energizing region being an area of the main surface through which the contact layer injects charge carriers into the semiconductor layer sequence; and
a thermal barrier layer arranged between a portion of the contact layer and the semiconductor layer sequence.

2. The semiconductor laser diode as claimed in claim 1, wherein the heat-dissipating layer is electrically insulating and has a thermal conductivity of at least 100 W/(K*m).

3. The semiconductor laser diode as claimed in claim 1, wherein the heat-dissipating layer contains diamond-like carbon, a carbide, a nitride or an oxide.

4. The semiconductor laser diode as claimed in claim 1, wherein a material coverage of the contact layer with the heat-dissipating layer decreases on average starting from a main emission axis with an increasing distance from the main emission axis and/or starting from the radiation output surface with an increasing distance from the radiation output surface.

5. The semiconductor laser diode as claimed in claim 1, wherein an area coverage of the contact layer with the heat-dissipating layer decreases on average starting from a main emission axis with an increasing distance from the main emission axis.

6. The semiconductor laser diode as claimed in claim 1, wherein an area coverage of the contact layer with the heat-dissipating layer decreases on average starting from the radiation output surface with an increasing distance from the radiation output surface.

7. The semiconductor laser diode as claimed in claim 1, wherein the heat-dissipating layer comprises subregions separated from one another at least in places, a spacing of the subregions increasing with an increasing distance from the radiation output surface and/or an extent of the subregions decreasing along the main emission axis.

8. The semiconductor laser diode as claimed in claim 1, wherein any point in the heat-dissipating layer is at most 10 μm away from the contact layer in the plan view of the semiconductor laser diode.

9. The semiconductor laser diode as claimed in claim 1, wherein a vertical extent of the heat-dissipating layer varies.

10. The semiconductor laser diode as claimed in claim 9, wherein the vertical extent of the heat-dissipating layer decreases with an increasing distance from the radiation output surface.

11. The semiconductor laser diode as claimed in claim 9, wherein the vertical extent of the heat-dissipating layer decreases with an increasing distance from a main emission axis.

12. The semiconductor laser diode as claimed in claim 1, wherein the thermal barrier layer is arranged on the semiconductor layer sequence outside an energizing region.

13. The semiconductor laser diode as claimed in claim 12, wherein the thermal barrier layer is arranged inside the contact layer in the vertical direction.

14. The semiconductor laser diode as claimed in claim 1, wherein the thermal barrier layer is arranged inside the contact layer such that the contact layer is on two sides of the thermal barrier layer.

15. The semiconductor laser diode as claimed in claim 1, further comprising a passivation layer that is arranged on the semiconductor sequence, wherein the passivation layer is arranged laterally with respect to an energizing region such that no direct current injection takes place in the vertical direction at positions that are covered by the passivation layer.

16. The semiconductor laser diode as claimed in claim 1, wherein the heat-dissipating layer defines a plurality of openings therein, and wherein the heat-dissipating layer and the openings are 100% arranged within the energizing region.

17. A semiconductor component comprising;
a semiconductor laser diode, the semiconductor laser diode comprising:
a semiconductor sequence having an active region intended to generate radiation,
a radiation output surface which extends perpendicularly to a main extent plane of the active region,
a main surface which delimits the semiconductor layer sequence in the vertical direction,
a contact layer which is directly adjacent to the main surface,
a heat-dissipating layer which is arranged in regions on a side of the contact layer facing away from the active region, wherein the heat-dissipating layer comprises at least one opening in which the contact layer is exposed, the opening of the heat-dissipating layer having an aspect ratio of at most 1:1, wherein, in a plan view of the semiconductor component, the heat-dissipating layer is arranged to have at least 70% of its total area inside an energizing region, the energizing region being an area of the main surface through which the contact layer injects charge carriers into the semiconductor layer sequence,
a thermal barrier layer arranged between a portion of the contact layer and the semiconductor layer sequence, and
a heat sink, the semiconductor laser diode being fastened on the heat sink by a connecting medium, the connecting medium being directly adjacent to the heat-dissipating layer and the contact layer.

18. The semiconductor component as claimed in claim 17, wherein the heat-dissipating layer has at least two times as great a thermal conductivity as the connecting medium.

19. The semiconductor laser diode as claimed in claim 1, wherein a thickness of the heat-dissipating layer decreases with an increasing distance from the radiation output surface.

20. The semiconductor component as claimed in claim 17, wherein a thickness of the heat-dissipating layer decreases with an increasing distance from a main emission axis.

21. A semiconductor component comprising;
a semiconductor laser diode comprising:
- a semiconductor sequence having an active region intended to generate radiation;
- a radiation output surface, which extends perpendicularly to a main extent plane of the active region;
- a main surface, which delimits the semiconductor layer sequence in the vertical direction;
- a contact layer which is directly adjacent to the main surface;
- a heat-dissipating layer, which is arranged in regions on a side of the contact layer facing away from the active region, the contact layer being exposed in places for external electrical contacting of the semiconductor laser diode, wherein the heat-dissipating layer is electrically insulating and has a thermal conductivity of at least 100 W/(K*m), wherein, in a plan view of the semiconductor laser diode, the heat-dissipating layer is arranged to have at least 70% of its total area inside an energizing region, in which the contact layer injects charge carriers through the main surface into the semiconductor layer sequence, wherein the heat-dissipating layer comprises at least one opening in which the contact layer is exposed, the opening of the heat-dissipating layer having an aspect ratio of at most 1:1, wherein, in a plan view of the semiconductor component, the heat-dissipating layer is arranged to have at least 70% of its total area inside an energizing region, the energizing region being an area of the main surface through which the contact layer injects charge carriers into the semiconductor layer sequence; and
- a thermal barrier layer arranged between a portion of the contact layer and the semiconductor layer sequence; and
a heat sink, the semiconductor laser diode being fastened on the heat sink by a connecting medium, the connecting medium being directly adjacent to the heat-dissipating layer and the contact layer.

22. The semiconductor component in claim 21, wherein the heat-dissipating layer is in a thermal path between the active region and the heat sink, and wherein the electrical contacting is carried out through regions of the contact layer that are not covered by the heat-dissipating layer.

* * * * *